US011143546B2

(12) United States Patent
Fehrenbach et al.

(10) Patent No.: US 11,143,546 B2
(45) Date of Patent: Oct. 12, 2021

(54) PIEZO-ELECTRIC TRANSCEIVER FOR A VIBRATION SENSOR, VIBRATION SENSOR WITH SUCH A PIEZO-ELECTRIC TRANSCEIVER, AND METHOD FOR PRODUCING A PIEZO-ELECTRIC TRANSCEIVER FOR A VIBRATION SENSOR

(71) Applicant: VEGA GRIESHABER KG, Wolfach (DE)

(72) Inventors: Dominik Fehrenbach, Rottweil (DE); Volker Allgaier, Haslach (DE)

(73) Assignee: VEGA GRIESHABER KG, Wolfach (DE)

( * ) Notice: Subject to any disclaimer, the term of this patent is extended or adjusted under 35 U.S.C. 154(b) by 255 days.

(21) Appl. No.: 16/212,779

(22) Filed: Dec. 7, 2018

(65) Prior Publication Data
US 2019/0368921 A1 Dec. 5, 2019

(30) Foreign Application Priority Data
Mar. 6, 2018 (EP) ..................................... 18160361

(51) Int. Cl.
*G01H 11/08* (2006.01)
*G01N 11/16* (2006.01)
*G01N 29/22* (2006.01)

(52) U.S. Cl.
CPC ............. *G01H 11/08* (2013.01); *G01N 11/16* (2013.01); *G01N 29/223* (2013.01)

(58) Field of Classification Search
CPC ....... G01H 11/08; G01N 11/16; G01N 29/223
See application file for complete search history.

(56) References Cited

U.S. PATENT DOCUMENTS

| 4,594,584 | A  | * | 6/1986  | Pfeiffer | G01F 23/2967 310/323.21 |
| 5,264,831 | A  | * | 11/1993 | Pfeiffer | G01F 23/2967 340/621 |
| 2004/0217672 | A1 | * | 11/2004 | Bindig | H01L 41/053 310/344 |
| 2011/0226064 | A1 | * | 9/2011  | Dreyer | G01N 29/022 73/632 |

FOREIGN PATENT DOCUMENTS

| DE | 10 2016 108 553 A1 | 11/2017 |
| DE | 102016108553 A1    | 11/2017 |
| EP | 1 909 078 A1       | 4/2008  |
| EP | 1909078 A1         | 4/2008  |
| JP | 5 288719 B2        | 9/2013  |
| JP | 5288719 B2         | 9/2013  |

OTHER PUBLICATIONS

Office Action for related European application 18160361.4, issued by European Patent Office dated Oct. 8, 2018.
EPO search report for parallel European application 18 160361.4, dated Oct. 8, 2018.

* cited by examiner

*Primary Examiner* — Paul M. West
(74) *Attorney, Agent, or Firm* — William Gray Mitchell (57) ABSTRACT

A Piezo-electric transceiver for a vibration sensor, with the Piezo-electric transceiver being embodied as a separately handled unit with a drive seat comprising a mechanical connection section for connecting the Piezo-electric transceiver to a mechanical oscillation unit of the vibration sensor.

8 Claims, 6 Drawing Sheets

Prior Art

PIEZO-ELECTRIC TRANSCEIVER FOR A VIBRATION SENSOR, VIBRATION SENSOR WITH SUCH A PIEZO-ELECTRIC TRANSCEIVER, AND METHOD FOR PRODUCING A PIEZO-ELECTRIC TRANSCEIVER FOR A VIBRATION SENSOR

CROSS REFERENCE TO RELATED APPLICATIONS

This patent application claims priority to European Patent Application 18160361.4, filed on Mar. 6, 2018.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The present invention relates to a piezo-electric transceiver for a vibration sensor, vibration sensor with such a Piezo-electric transceiver, and method for producing a Piezo-electric transceiver for a vibration sensor.

Background of the Invention

The present invention relates to a Piezo-electric transceiver for a vibration sensora vibration sensor comprising such a Piezo-electric transceiver, and a method for the production of a Piezo-electric transceiver.

Piezo-electric transceivers, vibration sensors comprising such Piezo-electric transceivers, as well as methods for the production of Piezo-electric transceivers are known from prior art. For example, Piezo-electric transceivers may be used in vibration sensors, which are frequently applied in fill level measuring technology as limit sensors, as transmission and/or receiving devices. Such a Piezo-electronic transceiver is often also called the drive unit.

Typically the vibration sensor comprises a diaphragm, which can be excited to vibrate by such a drive, by which a mechanical oscillator, arranged at the diaphragm, can be caused to vibrate. Depending on the cover status of the mechanical oscillator with filled good as well as depending on the viscosity of said filled good the mechanical oscillator vibrates with a characteristic frequency, which is detected by the vibration sensor, and is converted into a measuring signal.

In prior art, frequently two different types of drives are used. In a first variant, a Piezo-element, divided into several segments, is adhered to the diaphragm. By applying an electric voltage to one or more segments of the Piezo-element, it is excited to bend or distort and this is transferred to the diaphragm, which is this way caused to vibrate and triggers the mechanical oscillator to vibrate as well. This type of drive generates only a limited stroke and can only be used for vibration sensors, which are used below the glass transition temperature of the adhesive used and below the Curie-temperature of the Piezo-material used. In case of high-temperature applications above 150° C., these sensors are not suitable.

In the event that for a certain application a sensor with a higher stroke is required or the operation at higher temperatures is necessary, a second variant of drives is used, the so-called stacked Piezo-drive.

Here, a stack comprising a Piezo-unit with one or more Piezo-elements, one adjustment ceramic arranged each above and below the Piezo-unit, as well as pressure pieces arranged above and below the adjustment ceramics are clamped against the diaphragm via a clamping bolt arranged at the diaphragm of the sensor and a clamping nut. By applying an electric voltage to the Piezo-elements they change their extension in the axial direction of the bolt and this way cause the diaphragm to vibrate. A vibration sensor of prior art comprising a stacked Piezo-drive is shown in FIG. 4.

Figure 4:
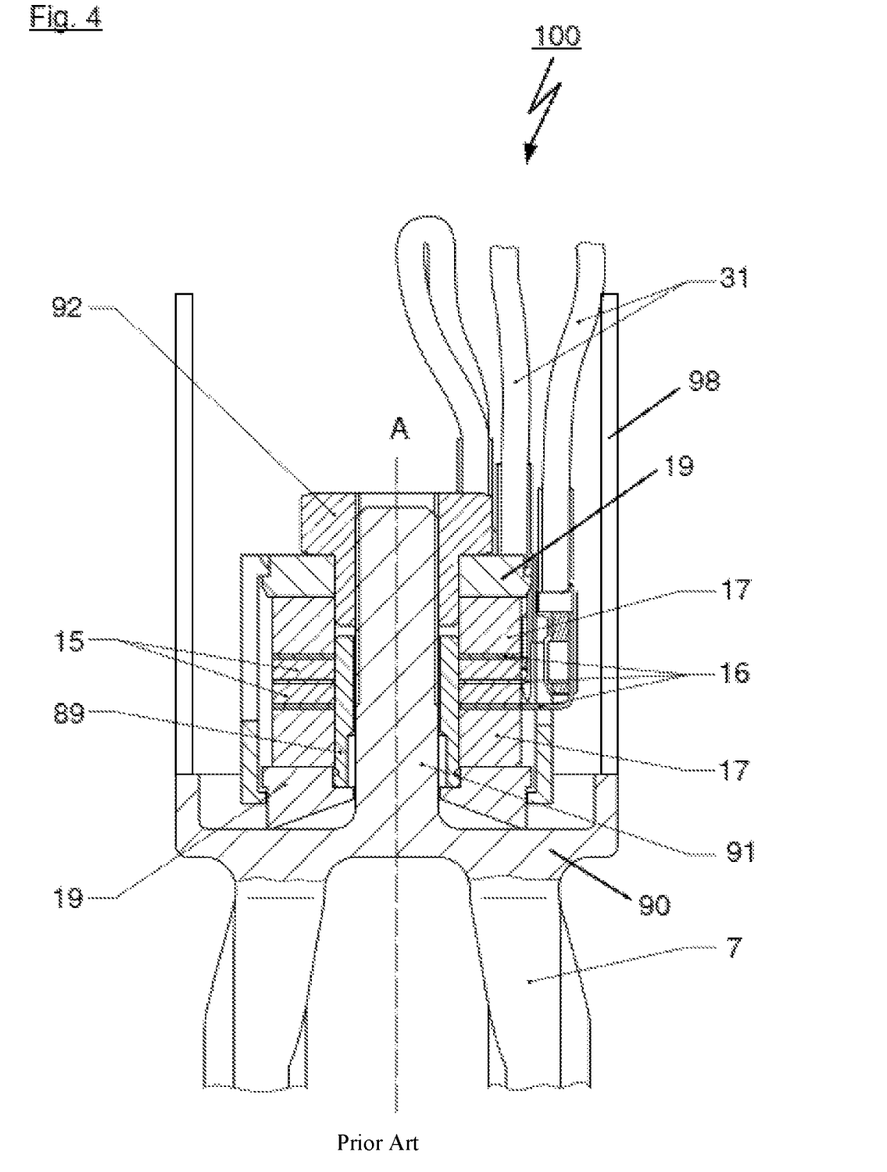
FIG. 4 a schematic illustration of a vibration sensor according to prior art (already discussed).

FIG. 4 shows a detail of a vibration sensor 100 known from prior art, which is used for example as a limit sensor in the fill level measuring technology.

The Piezo-electric transceiver 1 is clamped via a clamping bolt 91, formed in one piece at the diaphragm 90, via a clamping nut 92 against the diaphragm 90 such that vibrations of the Piezo-electric transceiver 1 are effectively transferred to the diaphragm 90 and vice versa. The electrodes 16 for contacting the Piezo-elements 15 contact connection lines 31, which extend at the exterior of the stacked Piezo-drive 11 and are guided at the rear to a sensor electronic. A sensor housing 98 is arranged at the diaphragm 90 via a circumferential exterior edge extending in the rear direction, which is connected to the edge of the diaphragm 90 or formed in one piece with it.

The vibration sensor 100 shows a stacked Piezo-drive 11 comprising Piezo-elements 15, stacked on top of each other and contacted via electrodes 16, with one adjustment ceramic 17 each being arranged above and below in the stack as well as a pressure piece 19, in the present case made from a metallic material. The adjustment ceramics 17 serve for the adjustment of a thermal expansion coefficient between the Piezo-elements 15 and the pressure pieces 19. The pressure pieces 19 are embodied such that an action of force is full-faced assumed from the Stacked Piezo-drive.

The vibration sensor 100 comprises a diaphragm 90, which can be excited to vibrate via a Piezo-electric transceiver 1, by which a mechanical oscillation unit 7 arranged at the diaphragm 90 can be excited to vibrate.

In case of coated vibration sensors, which are used for example in applications in acid, oil, gas, and the petrochemical industry, temperatures at a range above 400° C. are reached for the coating process. These temperatures are above the Curie-temperature of the Piezo-elements used, so that the Piezo-electric transceiver can only be installed after such a coating process.

Further, the vibration sensor 100 with the installed and biased drive 1 must be tempered and then the clamping nut 92 must be retightened. Without this operating step any correct function of the Piezo-electric transceiver 1 cannot be ensured, since sufficient bias is not given and thermal influences would only cause the drive 1 to settle upon operation at the end user.

This tempering of the completely assembled vibration sensor 100 is very expensive, particularly in so-called tubular versions, in which the vibration sensor can be fastened through a tubular extension at a greater distance from a top of the container, since these tubular versions can show lengths of up to 6 m. They can be inserted into a tempering kiln with great difficulty only.

The object of the present invention is to improve a Piezo-electric transceiver for a vibration sensor, a vibration sensor comprising such a Piezo-electric transceiver, as well as a method for producing a Piezo-electric transceiver for a vibration sensor such that a universal application of the Piezo-electric transceiver as well as a simplified assembly is possible.

This objective is attained in a Piezo-electric transceiver, a vibration sensor comprising such a Piezo-electric transceiver and a method for producing a Piezo-electric transceiver as described herein.

BRIEF SUMMARY OF THE INVENTION

In a preferred embodiment, a Piezo-electric transceiver (1) for a vibration sensor (100), characterized in that the Piezo-electric transceiver (1) is formed as a separately handled unit with a drive seat (3) with a mechanical connection section (5) for connecting the Piezo-electric transceiver (1) to a diaphragm (90) of the vibration sensor (100).

In another preferred embodiment, the Piezo-electric transceiver (1) as described herein, characterized in that the drive seat (3) comprises a fastening section (9) for fastening and pre-stressing a stacked Piezo-drive (11) in the drive seat (3).

In another preferred embodiment, the Piezo-electric transceiver (1) as described herein, characterized in that the stacked Piezo-drive (11) comprises a stack with a Piezo unit (13) showing at least one Piezo-element (15) as well as an adjustment ceramic (17) arranged respectively in the stack above and below the Piezo-unit (13).

In another preferred embodiment, the Piezo-electric transceiver (1) as described herein, characterized in that in the stack above and below the adjustment ceramic (17) respectively, a preferably metallic pressure piece (19) is arranged.

In another preferred embodiment, the Piezo-electric transceiver (1) as described herein, characterized in that the pressure pieces (19), the adjustment ceramics (17), as well as at least one Piezo-element (15) are formed with circular external contours and show an identical diameter (d).

In another preferred embodiment, the Piezo-electric transceiver (1) as described herein, characterized in that the stacked Piezo-drive (11) is clamped to the drive seat (3).

In another preferred embodiment, the Piezo-electric transceiver (1) as described herein, characterized in that the stacked Piezo-drive (11) is sintered into a monoblock.

In another preferred embodiment, the Piezo-electric transceiver (1) as described herein, characterized in that the Piezo-elements (15) each show a groove (21), in which a connection line (31) is arranged for contacting the Piezo-elements (15).

In another preferred embodiment, a vibration sensor (100) with a mechanical oscillation unit (7) arranged thereat that can be set into vibration and a second connection section (5) for connecting the diaphragm (90) to a Piezo-electric transceiver (1) such that vibrations of the Piezo-electric transceiver (1) are transferred to the diaphragm (90) and vibrations of the diaphragm (90) are transferred to the Piezo-electric transceiver (1), characterized in that the Piezo-electric transceiver (1) is formed as a separately handled unit according to any of the previous claims.

In another preferred embodiment, a method for producing a Piezo-electric transceiver (1) for a vibration sensor (100) with the following steps:
providing a drive seat (3),
arranging a stacked Piezo-drive (11) in the drive seat (3),
tightening a tension device (60) for pre-stressing the stacked Piezo-drive (11) with the drive seat (3) using a first predetermined torque ($M_1$),
tempering the Piezo-electric transceiver (1), and
retightening the clamping device (60) with a second predetermined torque ($M_2$).

In another preferred embodiment, the method as described herein, characterized in that the tempering occurs at a temperature below the Curie-temperature of the Piezo-materials used, but at least at 300° C. for at least 4 hours.

In another preferred embodiment, the method as described herein, characterized in that the first torque ($M_1$) ranges from 1.5 Nm to 2.5 Nm, preferably amounts to 2 Nm, and/or the second torque ($M_2$) ranges from 1.5 Nm to 2.5 Nm, preferably amounts to 2 Nm.

DETAILED DESCRIPTION OF THE INVENTION

The invention is a Piezo-electric transceiver for a vibration sensor is characterized in that the Piezo-electric transceiver is formed as a separately handled unit with a drive seat comprising a mechanical connection section for connecting the Piezo-electric transceiver to a diaphragm of the vibration sensor.

Due to the fact that the Piezo-electric transceiver, in the following also called drive, is formed as a separately handled unit it can be separately pre-assembled, biased, tempered, and retightened and then connected via its mechanical connection section to the diaphragm of the vibration sensor such that mechanical vibrations of the Piezo-electric transceiver are transferred to the diaphragm and vice versa. The embodiment according to the invention shows therefore the advantage that the Piezo-electric transceiver can be inserted, regardless if it represents a coated vibration sensor or a vibration sensor with a tubular extension, at any appropriate point of time during the assembly process. Additional tempering steps after the assembly of the drive are here not necessary.

The drive seat may show in particular a fastening section for fastening and pre-stressing a stacked Piezo-drive in the drive seat. Using a suitably sized fastening section the stacked Piezo-drive can this way be preassembled, biased, tempered, and retightened at or in the drive seat. This is advantageous in that the Piezo-electric transceiver can be separately produced and preassembled ready-to-use. By a suitably sized fastening section, i.e. particularly a sufficiently stable and torque-proof fastening section the stacked Piezo-drive can be biased for example via a suitable clamping device, which may be embodied as a clamping screw, for example.

The stacked Piezo-drive can for example comprise a stack showing one Piezo-unit with at least one Piezo-element, as well as an adjustment ceramic in the stack respectively above and below the Piezo-unit for adjusting the thermal expansion coefficient.

Further, in the stack above and below the adjustment ceramic respectively, one preferably metallic pressure piece may be arranged such that an action of force is full-faced assumed from the Piezo-unit. For this purpose the pressure pieces, the adjustment ceramics, as well as at least one Piezo-element may be formed with a circular external contour and identical diameter.

Advantageously the stacked Piezo-drive may be sintered into a monoblock. This is advantageous in that by the sintering of the drive more compact drives can be yielded, since the individual Piezo-elements can for example be connected to each other via electrically conductive sinter paste on a silver basis and can simultaneously be electrically contacted.

In order to facilitate this effect, the Piezo-elements may each shows a groove in which a connection line for contacting the Piezo-elements is arranged and this way can be integrated in the monoblock. This way the expense for the electric contacting of the Piezo-electric transceiver can be further reduced.

The grooves may be arranged at radially opposite sides on one side at the top and on the other side at the bottom in the Piezo-element. The grooves may be embodied extending in the radial direction, but also transverse thereto.

The stacked Piezo-drive sintered to form a monoblock can particularly not only comprise the Piezo-elements but also the adjustment ceramics and the pressure pieces such that a compact and separately handled unit is generated. The vibration sensor according to the invention comprising a mechanical oscillation unit arranged at the diaphragm that can be caused to vibrate comprises a second connection section for connecting the diaphragm with a Piezo-electric transceiver such that vibrations of the Piezo-electric transceiver are transferred to the diaphragm and vibrations of the diaphragm are transferred to the Piezo-electric transceiver, with the Piezo-electric transceiver being embodied as a separately handled unit according to the above description.

The method according to the invention for producing a Piezo-electric transceiver for a vibration sensor comprises the following steps:
  providing a drive seat,
  arranging a stacked Piezo-drive in the drive seat,
  tightening a clamping device for pre-stressing the stacked Piezo-drive with the drive seat using a first predetermined torque,
  tempering the Piezo-electric transceiver, and
  retightening the clamping device with a second predetermined torque.

The method according to the invention allows that the Piezo-electric transceiver can be completely preassembled, biased, tempered, and retightened without being installed in the sensor.

The tempering process shall particularly occur at a temperature below the Curie-temperature of the Piezo-materials used, but at least at a temperature of 300° C. for a period of at least 4 hours, so that the drive is sufficiently settled and can then be retightened.

Any biasing of the drive can occur for example with a first torque from 1.5 Nm to 2.5 Nm, preferably showing 2 Nm and/or the retightening with a second torque from 1.5 Nm to 2.5 Nm, preferably showing 2 Nm.

These torque forces achieve sufficiently good biasing of the drive, so that immediately after insertion in a sensor, i.e. after the connection of the Piezo-electric transceiver to the diaphragm it acts upon, operation can begin.

Unlike the Piezo-electric transceivers known from prior art for vibration sensors the drives according to the present invention work with pressure, i.e. so that via the pressure pieces 19, an action of force can be transferred from the stacked Piezo-drive 11 centrally to the diaphragm 90 and it can be deformed in the axial direction outwardly, from the point of view of the sensor, while in prior art a force introduced from the stacked Piezo-drive occurs into the diaphragm via tightening the clamping screw formed at the diaphragm.

DETAILED DESCRIPTION OF THE FIGURES

Figure 1:
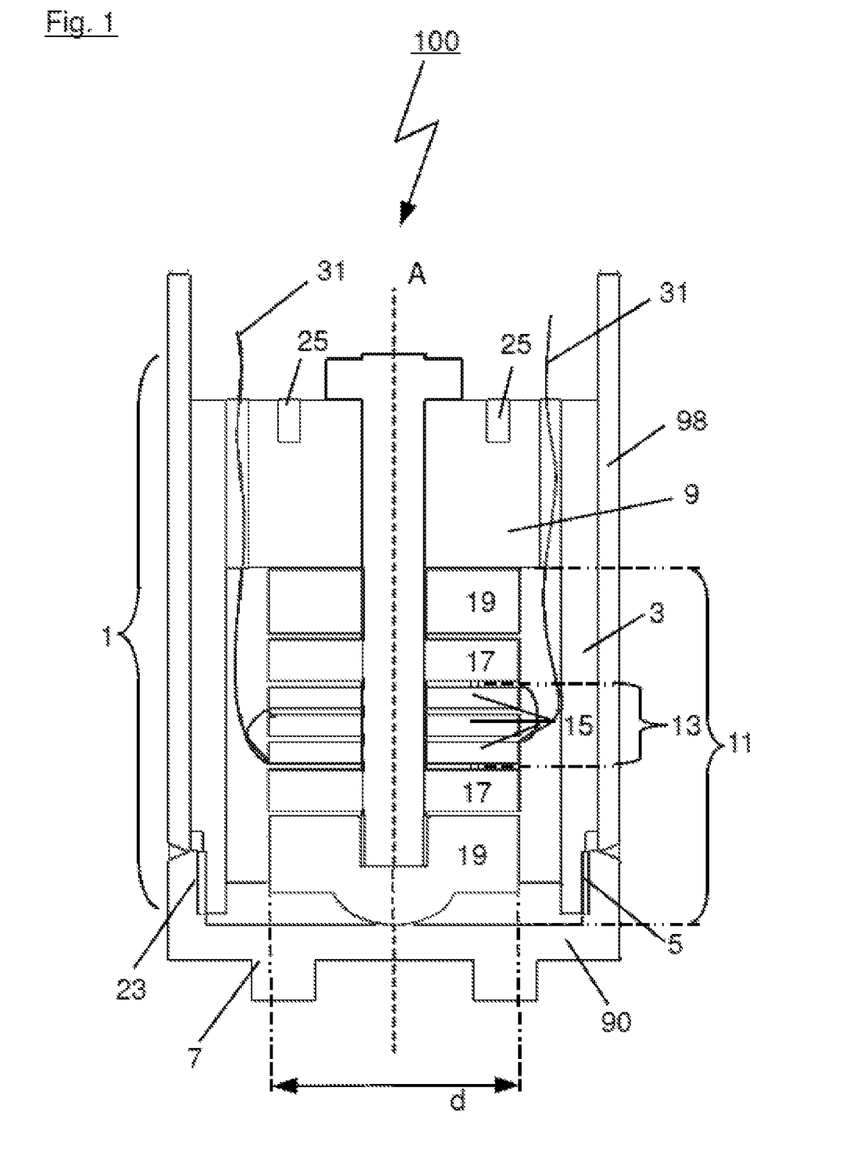
FIG. 1 is a schematic illustration evidencing a first exemplary embodiment of a vibration sensor according to the present invention.

FIG. 1 shows a schematic illustration of a vibration sensor 100, in which a Piezo-electric transceiver is arranged in a sensor housing 98, which is arranged at the rear of a diaphragm 90, supported in a manner that allows vibration, with a mechanical oscillation unit 7 being arranged at the front.

The Piezo-electric transceiver 1, hereinafter also called drive, is formed from an essentially cup-shaped drive seat 3, in which a stacked Piezo-drive 11 is arranged. The stacked Piezo-drive 11 is clamped to a fastening section 9 of the drive seat 3, with the fastening section 9 forming the base of the cup-shaped drive seat and showing a sufficiently sized thickness in order to compensate an action of force of the stacked Piezo-drive 11 without deformation of the fastening section 9.

The stacked Piezo-drive 11 is formed in the present exemplary embodiment from a Piezo-unit 13, adjustment ceramics 17 arranged above and below the Piezo-unit 13, as well as pressure pieces 19 arranged in the stack above and below the adjustment ceramics 17. The Piezo-unit 13 comprises in the present exemplary embodiment three Piezo-elements 15, which are formed by electrodes 16 (here not shown) arranged between the Piezo elements 15 and arranged above and below the Piezo-elements 15, which are contacted via connection lines 31.

By applying a voltage to the connection lines 31 the Piezo-elements 15 of the Piezo-unit 13 can be excited.

The adjustment ceramics 17, which are arranged above and below the Piezo-unit 11, serve for adjusting a thermal expansion coefficient of the Piezo-elements 15 to the pressure pieces 19 arranged above and/or below the adjustment ceramics 17. The pressure pieces 19 serve for the complete compensation and transmission of an action of force in the axial direction A of the stacked Piezo-drive 11 triggered in the Piezo-unit 13 by a voltage applied. The pressure piece 19 arranged at the diaphragm side comprises in the present exemplary embodiment an internal thread, in which a clamping screw 21 engages for pre-stressing the stacked Piezo-drive with the fastening section 9. Alternatively, the pressure piece 19 may also show a bolt formed thereat in one piece, which extends through the further components of the stacked Piezo-drive 11 in the direction of the fastening section 9 and is clamped thereto.

In the exemplary embodiment shown in FIG. 1 the Piezo-elements 15, the adjustment ceramics 17, as well as the upper pressure piece 19 facing the fastening section 9 are each embodied in an annular fashion such that the clamping screw 21 can be guided through these elements centrally in the axial direction A. The contacting of the Piezo-elements 15 of the Piezo-unit 13 occurs at the perimeter of the Piezo-elements, with the connection lines 31 being guided at the outside along the stacked Piezo-drive and through two apertures in the fastening section 9 at the rear, out of the Piezo-electric transceiver 1.

At the front, i.e. at the end of at the diaphragm side in the present illustration, the drive seat 3 comprises an external thread, which cooperates with an internal thread provided at a second mechanical connection section 23 formed at the diaphragm 90 and extending in the rear direction formed as a circumferential brace. This way the Piezo-electric transceiver 1 can be positively connected to the diaphragm 90 such that any extension of the stacked Piezo-drive 11 in the axial direction A, triggered by a voltage applied to the Piezo-elements 15, leads to a deformation of the diaphragm 90 in the axial direction A.

In order to promote an introduction of force into the diaphragm 90 and to ensure that the introduction of force occurs as centrally as possible, here the pressure piece 19 at the diaphragm side of the Piezo-electric transceiver comprises a calotte-shaped formation arranged centrally in the radial direction which extends in the axial direction A and through it the introduction of force occurs into the diaphragm 90.

In the present exemplary embodiment, when compared to the second mechanical connection section 23, the sensor housing 98 is considerably thinner and thus embodied in a less stable fashion and connected to it via a circumferential welded seam. The housing can therefore be produced from a rounded sheet metal and thus produced in a considerably more cost effective fashion.

In order to ensure proper operation of the vibration sensor 100 the Piezo-electric transceiver is fastened with a predetermined torque in the sensor housing 98 at the diaphragm 90. In order to prevent any loosening of the drive 1 when screwed-in this way, it is additionally fixed with locking varnish. In order to ensure good transfer of the required torque upon the drive seat 3 it is provided at the rear with recesses 25, in which suitable threading tools are inserted and thus the torque can be transferred.

Figure 2:
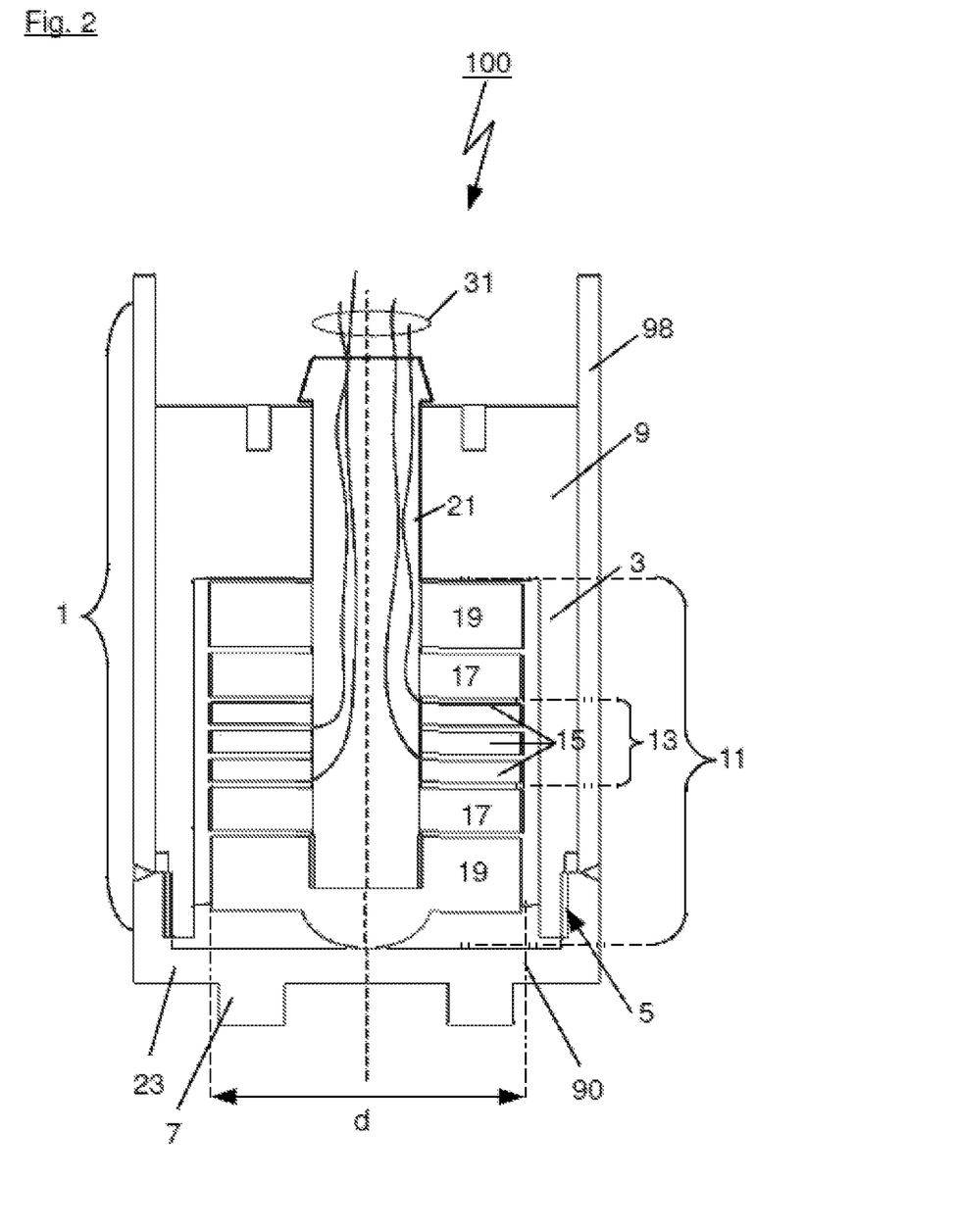
FIG. 2 is a schematic illustration evidencing a second exemplary embodiment of a vibration sensor according to the present invention.

FIG. 2 shows another exemplary embodiment of a vibration sensor 100 according to the present invention. The vibration sensor 100 according to the present invention comprises essentially the structure of the vibration sensor 100 described in reference to FIG. 1, with unlike the exemplary embodiment according to FIG. 1, in the exemplary embodiment according to FIG. 2, the connection line 31 for contacting the Piezo-elements 15 of the Piezo-unit 13 is guided not along the outside at the stacked Piezo-drive 11 but inside a hollow embodied clamping device 21, which is guided centrally through the elements of the stacked Piezo-drive 11. This interior guidance of the connection lines 31 allows embodying the components of the stacked Piezo-drive 11 with a larger diameter d, compared to the embodiment according to FIG. 1. However, it is necessary here that an opening, through which the voltage 21 is guided, shows a slightly larger diameter. This may however lead to a maximizing of the area of the annular ring and thus a maximizing of the action of force of the stacked Piezo-drive possible.

Figure 3:
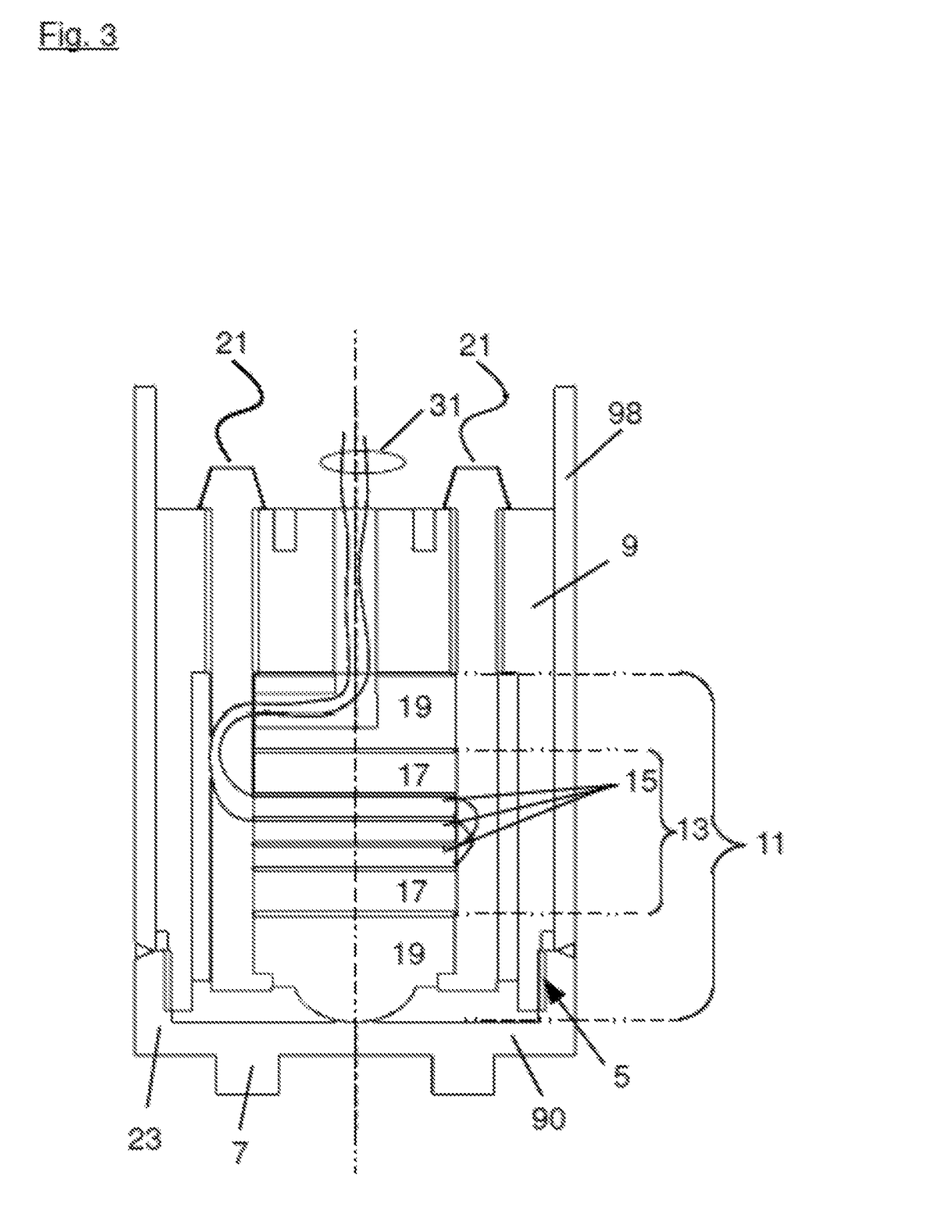
FIG. 3 is a schematic illustration evidencing a third exemplary embodiment of a vibration sensor 100 according to the present invention.

In another embodiment, shown in FIG. 3, the elements of the stacked Piezo-drive 11 are embodied as circular disks, with a bias of the stacked Piezo-drive 11 occurring via two clamping devices 21 guided along the outside of the stack and engaging the perimeter of the pressure piece 19 arranged at the diaphragm side. This embodiment can be selected for example when a design of the stacked Piezo-drive 11 with ring-shaped Piezo-elements 15 is not desired.

As an alternative to the connection of the Piezo-electric transceiver shown in FIGS. 1 to 3 via an external thread 5 arranged at the drive seat 3, which cooperates with an internal thread arranged at the diaphragm 90 and/or at the second mechanical connection section 23 provided thereat, the Piezo-electric transceiver may also be achieved by compressing the drive seat 3 with the second mechanical connection section 23.

Figure 5:
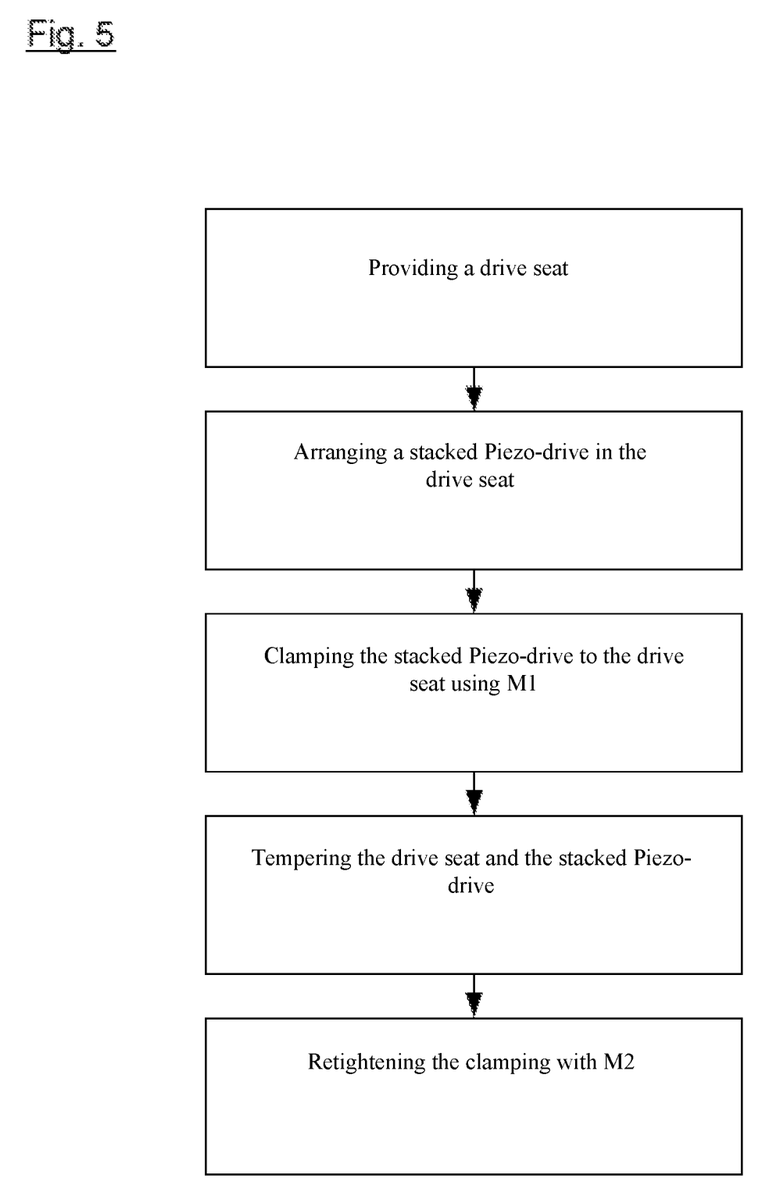
FIG. 5 is a flow chart evidencing a production method for a Piezo-electric transceiver.

A method for producing a Piezo-electric transceiver according to the present invention is shown in FIG. 5.

FIG. 5 shows an exemplary progression for a production method according to the present invention.

In a first step a drive seat 3 is provided, which is embodied suitable for a connection via a connection section 5 to the diaphragm 90 of a vibration sensor 100. Then a stacked Piezo-drive 11 is inserted into the drive seat 3, either in the form of individual parts or as a unit sintered into a monoblock, and clamped to the drive seat 3 in another step. The clamping occurs with a first predetermined torque M1. Then the Piezo-electric transceiver 100 preassembled in this fashion is tempered, i.e. stored at a predetermined temperature, for example 300° C., for a duration of 4 hours and then retightened such that the bias is generated showing a second torque M2, which may be identical to the first torque M1. By the fact that the components of the Piezo-electric transceiver 100 may have settled during the tempering step, it can be assumed that such processes will no longer occur to a larger extent and thus the drive is preassembled ready to use.

Figure 6:
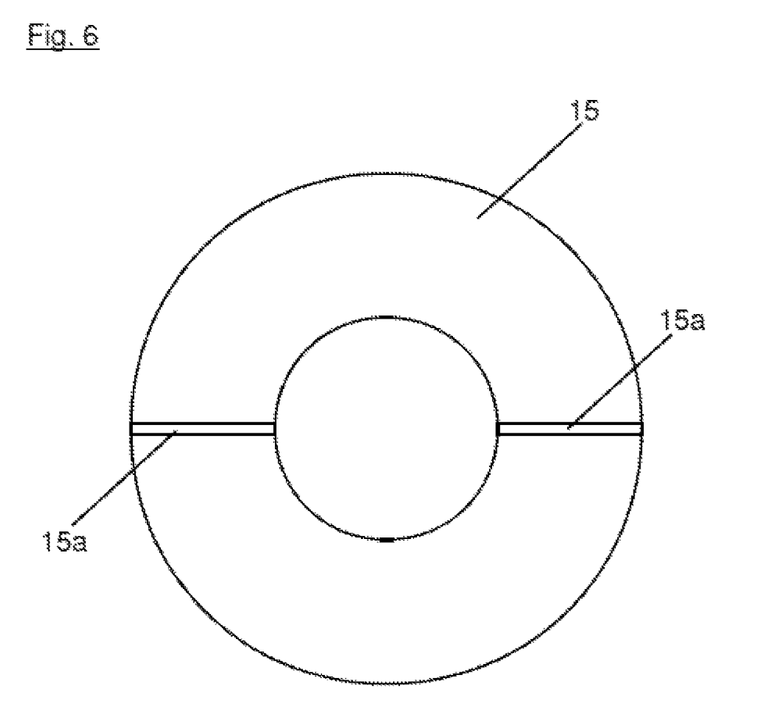
FIG. 6 is a line drawing evidencing a Piezo-electric element embodied as a disc.

FIG. 6 shows a Piezo-element 15 embodied as an annular disk, which comprises a groove 15a inserted into the Piezo elements 15 at radially opposite sides on one side at the top and on the radially opposite side at the bottom. For generating a Piezo-unit 13, the Piezo-elements 15 can be sintered with a stacked Piezo-drive 11 together with the connection lines 31 to form a monoblock.

LIST OF COMPONENTS

1 Piezo-electric transceiver
3 Drive seat
5 Mechanical connection section/external thread
7 Mechanical oscillation unit
9 Fastening section
11 Stacked Piezo-drive
13 Piezo-unit
15 Piezo-element
16 Electrodes
17 Adjustment ceramic
19 Pressure piece
21 Clamping screw/nut
23 Second mechanical connection section
25 Recesses
31 Connection line
89 Sheath
90 Diaphragm
91 Clamping bolt
92 Clamping nut
98 Sensor housing
100 Vibration sensor A Axial direction
D Diameter
M₁ First torque
M₂ Second torque

We claim:

1. A Piezo-electric transceiver for a vibration sensor, wherein the Piezo-electric transceiver is embodied as a preassembled, ready-to-use unit with a drive seat with a mechanical connection section for connecting the Piezo-electric transceiver to a diaphragm of the vibration sensor wherein the drive seat comprises a fastening section for fastening and pre-stressing a stacked Piezo-drive in the drive seat and the stacked Piezo-drive is clamped to the drive seat.

2. The Piezo-electric transceiver according to claim 1, wherein the stacked Piezo-drive comprises a stack with a Piezo unit showing at least one Piezo-element as well as an adjustment ceramic arranged respectively in the stack above and below the Piezo-unit.

3. The Piezo-electric transceiver according to claim 2, wherein in the stack above and below the adjustment ceramic respectively, a metallic pressure piece is arranged.

4. The Piezo-electric transceiver according to claim 3, wherein the pressure pieces, the adjustment ceramics, as well as at least one Piezo-element are formed with circular external contours and show an identical diameter.

5. The Piezo-electric transceiver according to claim 2, wherein the stacked Piezo-drive is sintered into a monoblock.

6. The Piezo-electric transceiver according to claim 1, wherein the stacked Piezo-drive is clamped to the drive seat.

7. The Piezo-electric transceiver according to claim 5, wherein the Piezo-elements each show a groove, in which a connection line is arranged for contacting the Piezo-elements.

8. A vibration sensor with a mechanical oscillation unit arranged thereat that can be set into vibration and a second connection section for connecting a diaphragm of the vibration sensor to a Piezo-electric transceiver such that vibrations of the Piezo-electric transceiver are transferred to the diaphragm and vibrations of the diaphragm are transferred to the Piezo-electric transceiver, wherein the Piezo-electric transceiver is formed as a separately handled unit according to claim 1.

* * * * *